United States Patent
Nakaiso

(10) Patent No.: US 10,608,609 B2
(45) Date of Patent: Mar. 31, 2020

(54) LC FILTER AND METHOD OF MANUFACTURING LC FILTER

(71) Applicant: Murata Manufacturing Co., Ltd., Nagaokakyo-shi, Kyoto-fu (JP)

(72) Inventor: Toshiyuki Nakaiso, Nagaokakyo (JP)

(73) Assignee: MURATA MANUFACTURING CO., LTD., Nagaokakyo-Shi, Kyoto-Fu (JP)

(*) Notice: Subject to any disclaimer, the term of this patent is extended or adjusted under 35 U.S.C. 154(b) by 0 days.

(21) Appl. No.: 16/030,106

(22) Filed: Jul. 9, 2018

(65) Prior Publication Data

US 2018/0316331 A1 Nov. 1, 2018

Related U.S. Application Data

(63) Continuation of application No. PCT/JP2017/026757, filed on Jul. 25, 2017.

(30) Foreign Application Priority Data

Aug. 12, 2016 (JP) ................................. 2016-158383

(51) Int. Cl.
*H03H 7/01* (2006.01)
*H03H 3/00* (2006.01)
(Continued)

(52) U.S. Cl.
CPC ....... *H03H 7/0115* (2013.01); *H01F 27/2804* (2013.01); *H01F 27/323* (2013.01);
(Continued)

(58) Field of Classification Search
CPC . H03H 7/0115; H03H 2001/0085; H03H 3/00
(Continued)

(56) References Cited

U.S. PATENT DOCUMENTS 5,604,383 A 2/1997 Matsuzaki
6,922,129 B2 7/2005 Aoyagi
(Continued)

FOREIGN PATENT DOCUMENTS

JP H07307440 A 11/1995
JP H0955583 A 2/1997
(Continued)

OTHER PUBLICATIONS

International Search Report issued in PCT/JP2017/026757, dated Oct. 17, 2017.
(Continued)

*Primary Examiner* — Rakesh B Patel
(74) *Attorney, Agent, or Firm* — Arent Fox LLP

(57) ABSTRACT

An LC filter having a multilayer body, coil conductor patterns, a thin-film capacitor, and input/output terminal conductors. The multilayer body is formed by stacking a plurality of resin sheets. At least a portion of the coil conductor pattern is embedded in a resin sheet. The thin-film capacitor is at least partially embedded in the resin sheet, is disposed in the coil opening of the coil conductor pattern, which is spiral-shaped, and is connected to the coil conductor pattern. The thickness of the coil conductor patterns is smaller than the thickness of the resin sheets, and the thickness of the thin-film capacitor is smaller than the thickness of the resin sheets.

13 Claims, 9 Drawing Sheets

(51) Int. Cl.
  *H01G 4/40* (2006.01)
  *H01F 27/28* (2006.01)
  *H01F 27/32* (2006.01)
  *H01F 27/40* (2006.01)
  *H01F 41/04* (2006.01)
  *H01G 4/228* (2006.01)
  *H03H 1/00* (2006.01)
  *H01G 4/33* (2006.01)
  *H01F 17/00* (2006.01)

(52) U.S. Cl.
  CPC ............ *H01F 27/40* (2013.01); *H01F 41/041* (2013.01); *H01G 4/228* (2013.01); *H01G 4/40* (2013.01); *H03H 1/00* (2013.01); *H03H 3/00* (2013.01); *H01F 17/0013* (2013.01); *H01F 2017/0026* (2013.01); *H01F 2027/2809* (2013.01); *H01G 4/33* (2013.01); *H03H 2001/0078* (2013.01); *H03H 2001/0085* (2013.01)

(58) Field of Classification Search
  USPC .................................................. 333/175, 185
  See application file for complete search history.

(56) References Cited

U.S. PATENT DOCUMENTS

| | | | |
|---|---|---|---|
| 7,161,241 | B2 | 1/2007 | Kimura |
| 7,667,951 | B2 | 2/2010 | Kuwajima et al. |
| 7,812,689 | B2 | 10/2010 | Atsumo et al. |
| 8,791,783 | B2 | 7/2014 | Miyazaki et al. |
| 10,091,886 | B2 | 10/2018 | Nishino et al. |
| 2003/0030994 | A1* | 2/2003 | Takaya ..................... H01F 5/06 361/728 |
| 2003/0168727 | A1 | 9/2003 | Kimura |
| 2004/0080922 | A1 | 4/2004 | Aoyagi |
| 2007/0069835 | A1* | 3/2007 | Kamgaing ............... H03H 5/02 333/185 |
| 2007/0109719 | A1 | 5/2007 | Kuwajima et al. |
| 2009/0140825 | A1 | 6/2009 | Atsumo et al. |
| 2010/0045401 | A1* | 2/2010 | Endo ........................ H03H 7/42 333/26 |
| 2013/0200977 | A1 | 8/2013 | Miyazaki et al. |
| 2017/0042033 | A1 | 2/2017 | Nishino et al. |

FOREIGN PATENT DOCUMENTS

| | | |
|---|---|---|
| JP | H10129165 A | 5/1998 |
| JP | 2002111222 A | 4/2002 |
| JP | 2002261421 A | 9/2002 |
| JP | 3093578 U | 5/2003 |
| JP | 3578026 B2 | 10/2004 |
| JP | 2004304178 A | 10/2004 |
| JP | 2005310054 A | 11/2005 |
| JP | 2007142109 A | 6/2007 |
| JP | 2008172075 A | 7/2008 |
| WO | 2011145490 A1 | 11/2011 |
| WO | 2015194373 A1 | 4/2017 |

OTHER PUBLICATIONS

Written Opinion of the International Searching Authority issued in issued in PCT/JP2017/026757, dated Oct. 17, 2017.

* cited by examiner

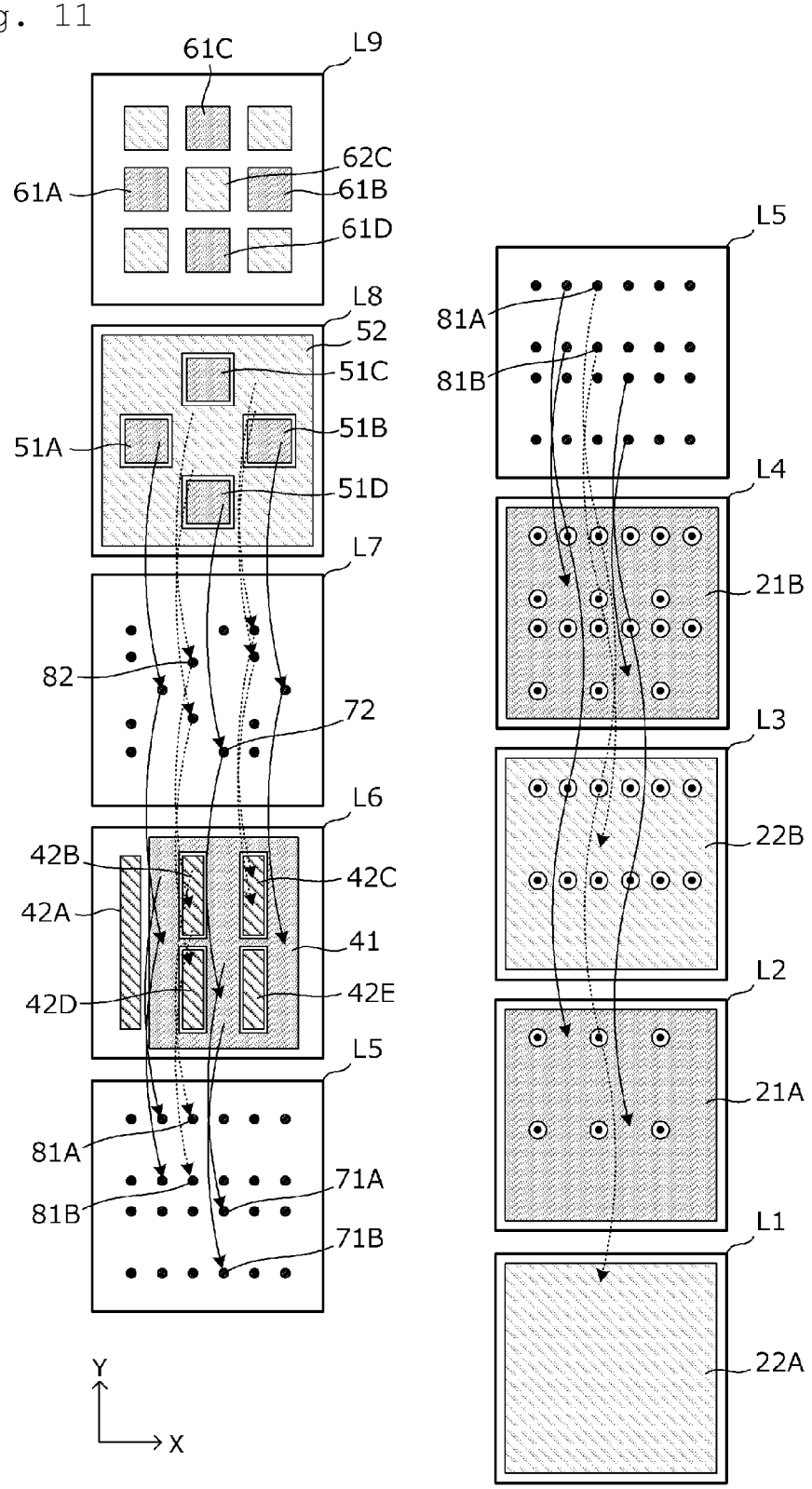

LC FILTER AND METHOD OF MANUFACTURING LC FILTER

CROSS REFERENCE TO RELATED APPLICATIONS

The present application is a continuation of PCT/JP2017/026757 filed Jul. 25, 2017, which claims priority to Japanese Patent Application No. 2016-158383, filed Aug. 12, 2016, the entire contents of each of which are incorporated herein by reference.

TECHNICAL FIELD

The present disclosure relates to an LC filter that includes a coil formed of a conductor formed in a multilayer body and a capacitor embedded in the multilayer body.

BACKGROUND

Patent Document 1 (identified below) discloses an LC filter. The LC filter of Patent Document 1 includes a multilayer body, coil conductor patterns, and a chip capacitor component.

The multilayer body is formed by stacking and heat-pressing a plurality of thermoplastic resin sheets. The conductor patterns are formed on a predetermined plurality of the thermoplastic resin sheets. The coil conductor patterns of the plurality of thermoplastic resin sheets are connected by interlayer connection conductors. As a result, a helical coil is formed in the multilayer body. A chip capacitor is disposed in the multilayer body so as to overlap the central cavity of the helical coil.

Patent Document 1: International Publication No. JPWO2015/194373 patent.

However, in the LC filter having the structure described in Patent Document 1, because the thermoplastic resin sheets flow during heat-pressing, the shape of the coil conductor patterns may collapse in some cases. If the shape of the coil conductor patterns collapses, filter characteristics desirable for a coil may not be achieved in some cases. In particular, in helical coils, variations in coupling capacitances between coil conductor patterns aligned in the stacking direction become large, and it is difficult to stably obtain desired filter characteristics (S11, S21, and the like).

In addition, in the configuration described in Patent Document 1, because the chip capacitor is incorporated in the multilayer body and a hole for accommodating the chip capacitor is not provided in the multilayer body, the flatness of the front surface and the rear surface of the multilayer body ends up being reduced. When the flatness of the front surface and the rear surface of the multilayer body is reduced, mounting defects are likely to occur.

SUMMARY OF THE INVENTION

Accordingly, an object of the present disclosure is to provide an LC filter with front and rear surfaces having a high flatness while achieving desired characteristics.

The exemplary LC filter of the present disclosure includes a multilayer body, a coil conductor pattern, a thin-film capacitor, and input/output terminal conductors. The multilayer body is formed by stacking a plurality of resin sheets. The coil conductor pattern is embedded in a first resin sheet among the plurality of resin sheets. The thin-film capacitor is embedded in the first resin sheet, is disposed in a coil opening of the coil conductor pattern in a plan view of the first resin sheet, with the coil conductor pattern being spiral-shaped, and the thin-film capacitor being connected to the coil conductor pattern. The thickness of the coil conductor pattern is smaller than the thickness of the first resin sheet, and the thickness of the thin-film capacitor is smaller than the thickness of the first resin sheet.

In this configuration, because the coil conductor pattern and the thin-film capacitor are thinner than the first resin sheet and at least a part of each of the coil conductor pattern and the thin-film capacitor is embedded in the first resin sheet, positional displacement of the coil conductor pattern in the process of manufacturing the multilayer body and a decrease in flatness as a result of incorporating a mounting type capacitor in the multilayer body are suppressed.

In addition, in the LC filter described herein, the thickness of the thin-film capacitor is preferably the same or substantially the same as the thickness of the coil conductor pattern. In this aspect, the term "substantially" accounts for minor variations that may occur during manufacturing, for example.

In this configuration, the flatness is further improved.

In addition, in the LC filter described herein, the multilayer body preferably includes a first surface perpendicular to a stacking direction of the plurality of resin sheets. The input/output terminal conductors are formed on the first surface of the multilayer body. The input/output terminal conductors include a ground connection terminal conductor. The thin-film capacitor includes, on an external connection surface thereof, at least one terminal conductor that connects to a ground connection terminal conductor. The thin-film capacitor is disposed inside the multilayer body so that the external connection surface faces the first surface.

With this configuration, it is easy to shorten the connection distance between the ground connection terminal conductor and the terminal conductor of the thin-film capacitor. Thus, it is easy to suppress parasitic inductance on the ground side of the thin-film capacitor.

In addition, in the LC filter described herein, it is preferable that a wiring conductor that connects the terminal conductor of the thin-film capacitor and the ground connection terminal conductor to each other be formed between the external connection surface and the first surface in the stacking direction.

With this configuration, the connection distance between the ground connection terminal conductor and the terminal conductor of the thin-film capacitor can be shortened. As a result, parasitic inductance on the ground side of the thin-film capacitor is suppressed.

In addition, in the LC filter described herein, the terminal conductor of the thin-film capacitor is preferably provided in a plurality. The wiring conductor connects the plurality of terminal conductors of the thin-film capacitor to the common ground connection terminal conductor.

In this configuration, a plurality of parasitic inductances are connected in parallel to the ground side of the thin-film capacitor. As a result, parasitic inductance on the ground side of the thin-film capacitor is further suppressed.

In addition, the method of manufacturing an LC filter according to an exemplary aspect includes the following steps. The manufacturing method includes a step of forming a spiral-shaped coil conductor pattern on a surface of an auxiliary resin sheet, and a step of disposing a thin-film capacitor in a coil opening of the spiral-shaped coil conductor pattern on the surface of the auxiliary resin sheet. The manufacturing method includes a step of forming a first resin sheet on the surface of the auxiliary resin sheet to cover the coil conductor pattern and the thin-film capacitor.

In the manufacturing method, positional displacement of the coil conductor pattern does not occur and an LC filter having a multilayer body with a high degree of flatness can be easily manufactured.

In addition, in the method of manufacturing an LC filter described herein, the following method can be adopted. A plurality of resin sheets including the auxiliary resin sheet and the first resin sheet have thermoplastic properties. A multilayer body is formed by stacking the plurality of resin sheets and heat-pressing the plurality of resin sheets.

In this manufacturing method, flow of the resin sheets occurs during the formation of the multilayer body; however, in the above-described configuration, the positional displacement of the coil conductor pattern hardly occurs and the lowering of the flatness of the multilayer body is also suppressed.

According to the exemplary embodiments of the present disclosure, an LC filter is provided that has front and rear surfaces with a high flatness while achieving desired characteristics.

BRIEF DESCRIPTION OF DRAWINGS

FIG. 11 is a disassembled plan view illustrating a connection relationship between conductors in layers of the thin-film capacitor.

DETAILED DESCRIPTION OF EMBODIMENTS

Figure 1:
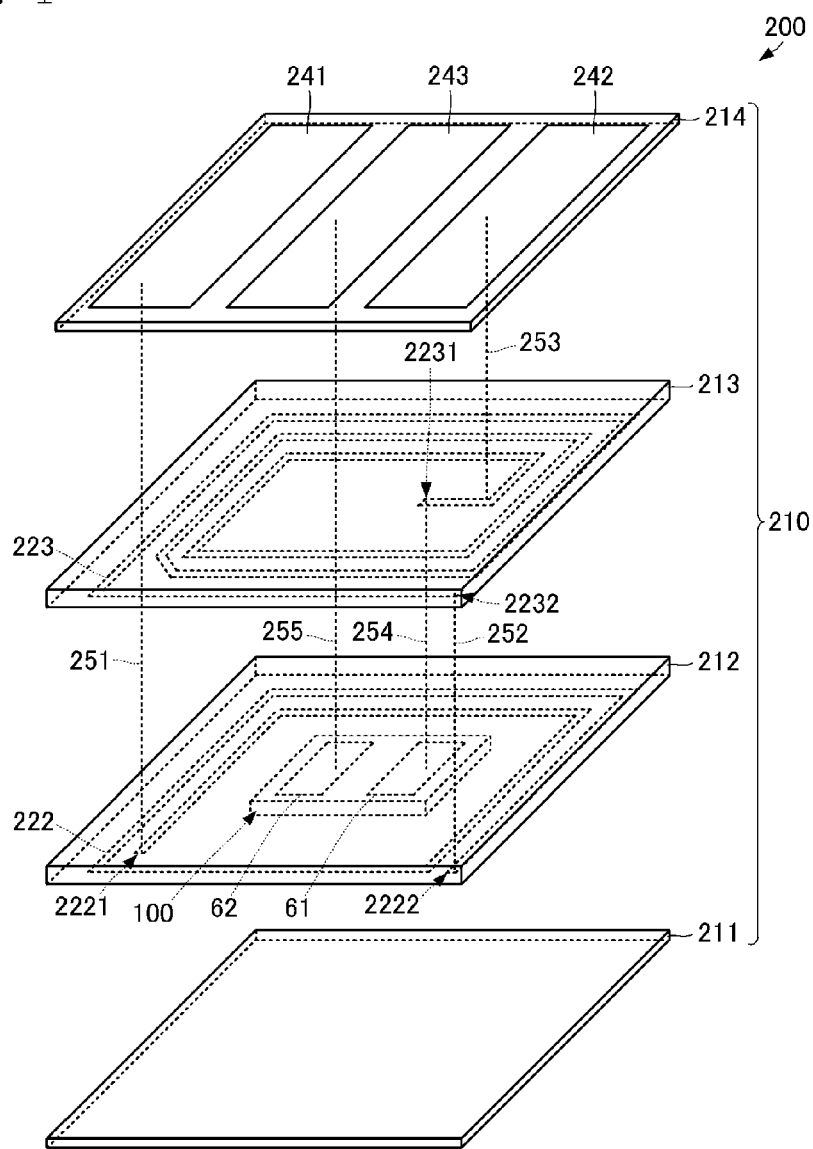
FIG. 1 is an exploded perspective view of an LC filter according to a first exemplary embodiment.
Figure 2:
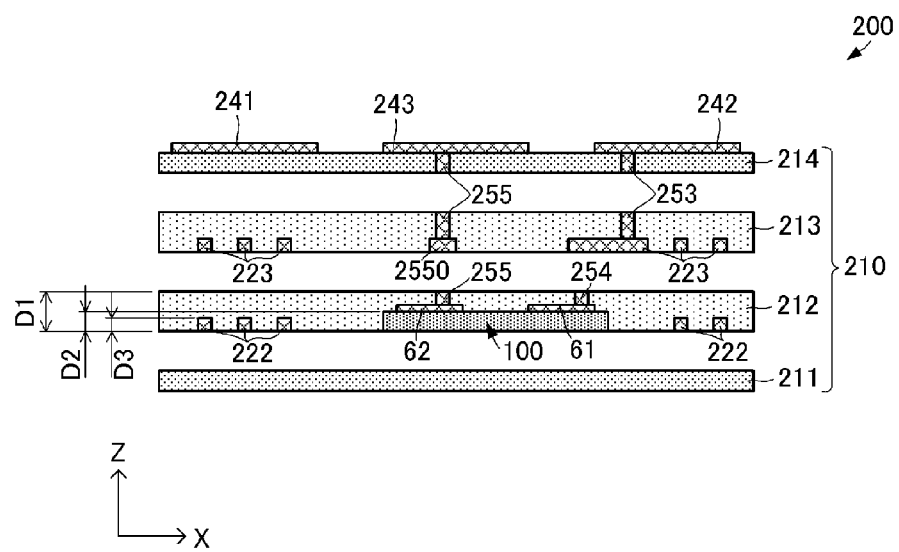
FIG. 2 is a cross-sectional view illustrating a configuration of an LC filter according to a first exemplary embodiment.
Figure 3:
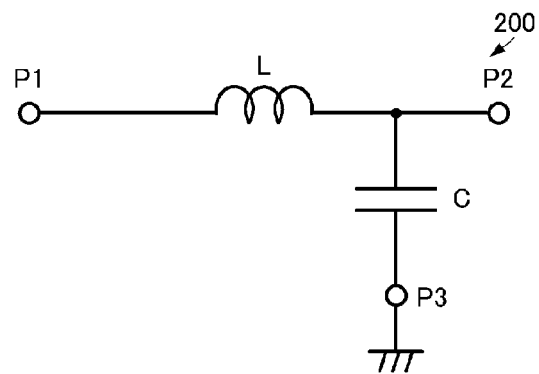
FIG. 3 is an equivalent circuit diagram of the LC filter according to the first exemplary embodiment.

An LC filter according to a first exemplary embodiment will be described with reference to the drawings. FIG. 1 is an exploded perspective view of an LC filter according to the first exemplary embodiment. FIG. 2 is a cross-sectional view illustrating a configuration of the LC filter according to the first exemplary embodiment. FIG. 3 is an equivalent circuit diagram of the LC filter according to the first exemplary embodiment.

(Circuit of LC Filter 200)

As illustrated in FIG. 3, an LC filter 200 includes an inductor L and a capacitor C, and has terminals P1, P2, and P3. The inductor L is connected between the terminal P1 and the terminal P2. The capacitor C is connected between the terminal P2 and the terminal P3. Moreover, the terminals P1 and P2 are input/output terminals for transmission signals, and the terminal P3 is a terminal connected to the ground potential.

With this configuration, the LC filter 200 functions as a low pass filter as is known to one skilled in the art.

(Structure of LC Filter 200)

As illustrated in FIG. 1 and FIG. 2, the LC filter 200 includes a multilayer body 210, coil conductor patterns 222 and 223, and a thin-film capacitor 100, and includes input/output terminal conductors 241, 242, and 243.

According to the exemplary embodiment, the multilayer body 210 is formed by stacking a plurality of resin sheets 211, 212, 213, and 214. Moreover, the plurality of the resin sheets 211, 212, 213, and 214 may be any insulating material, and a dielectric material, a magnetic material, or the like can be used. In addition, either a thermoplastic resin or a thermosetting resin can be used to form the plurality of the resin sheets 211, 212, 213, and 214. The plurality of the resin sheets 211, 212, 213, and 214 are stacked in this order. In an exemplary aspect, the thickness of the resin sheet 211 and the thickness of the resin sheet 214 are substantially the same, and the thickness of the resin sheet 212 and the thickness of the resin sheet 213 are substantially the same. Moreover, the thicknesses of the resin sheet 212 and the resin sheet 213 are larger than the thicknesses of the resin sheet 211 and the resin sheet 214, but are not limited thereto.

The multilayer body 210 is rectangular when viewed in the stacking direction (i.e., as viewed in the Z direction) of the plurality of the resin sheets 211, 212, 213, and 214. The two directions that are perpendicular to each other and that form this rectangle are the X direction and the Y direction.

The coil conductor pattern 222 is formed on the surface of the resin sheet 212 on the resin sheet 211 side. The coil conductor pattern 222 has a winding shape with a plurality of turns when viewed in the Z direction. That is, the coil conductor pattern 222 has a spiral shape according to the exemplary embodiment. Preferably, the coil conductor pattern 222 is formed in the vicinity of the four side edges of the resin sheet 212 and is wound along the four side edges.

The thickness of the coil conductor pattern 222 (i.e., a dimension D3 in the Z direction) is smaller than the thickness of the resin sheet 212 (i.e., a dimension D1 in the Z direction) as shown in FIG. 2, for example. Moreover, the coil conductor pattern 222 is embedded in the resin sheet 212 in a state of being exposed on the surface on the resin sheet 211 side.

The coil conductor pattern 223 is formed on the surface of the resin sheet 213 on the resin sheet 212 side. The coil conductor pattern 223 has a winding shape with a plurality of turns when viewed in the Z direction. That is, the coil conductor pattern 223 has a spiral shape. The coil conductor pattern 223 is formed in the vicinity of the four side edges of the resin sheet 213 and is wound along the four side edges.

The thickness of the coil conductor pattern 223 is substantially the same as the thickness of the coil conductor pattern 222. The thickness of the coil conductor pattern 223 is smaller than the thickness of the resin sheet 213. The coil conductor pattern 223 is embedded in the resin sheet 213 in a state of being exposed on the surface on the resin sheet 212 side.

According to the exemplary embodiment, an outer end 2232 of the coil conductor pattern 223 is connected to an outer end 2222 of the coil conductor pattern 222 via an interlayer connection conductor 252. In this aspect, the coil conductor patterns 222 and 223 and the interlayer connection conductor 252 correspond to the inductor L in FIG. 1.

As further shown, the input/output terminal conductors 241, 242, and 243 are formed on the surface of the resin sheet 214 on the side opposite to the resin sheet 213 side. The input/output terminal conductors 241, 242, and 243 are rectangular when viewed in the Z direction, and are arranged with a space therebetween in the X direction. The input/output terminal conductor 243 is arranged between the input/output terminal conductor 241 and the input/output terminal conductor 242 in the X direction. The input/output terminal conductor 241 corresponds to the terminal P1 in FIG. 1, the input/output terminal conductor 242 corresponds to the terminal P2 in FIG. 1, and the input/output terminal conductor 243 corresponds to the terminal P3 in FIG. 1.

The input/output terminal conductor 241 is connected to an inner end 2221 of the coil conductor pattern 222 via an interlayer connection conductor 251. The input/output terminal conductor 242 is connected to the vicinity of an inner end 2231 of the coil conductor pattern 223 via an interlayer connection conductor 253.

As further shown in FIG. 2, the thin-film capacitor 100 has a thin flat plate shape and is provided with terminal conductors 61 and 62 on a rear surface thereof perpendicular to the thickness direction. The thickness of the thin-film capacitor 100 (i.e., dimension D2 in the Z direction) is smaller than the thickness of the resin sheet 212 (i.e., dimension D1 in the Z direction). In addition, the thin-film capacitor 100 is embedded in the resin sheet 212 such that a front surface thereof is exposed to the surface on the resin sheet 211 side. In this aspect, the thin-film capacitor 100 corresponds to the capacitor C in FIG. 1.

Further, as the material of the thin-film capacitor 100, any of various known ones can be used. That is, the thin-film capacitor 100 may have any structure as long as the thickness thereof is significantly smaller than the other dimensions and the terminal conductors 61 and 62 are formed on a surface perpendicular to the thickness direction. However, it is preferable that the thin-film capacitor 100 have a low ESL and a low ESR.

Moreover, the thin-film capacitor 100 is disposed in a coil opening of the coil conductor pattern 222 and a coil opening of the coil conductor pattern 223 when viewed in the Z direction.

In this configuration, the thin-film capacitor 100 is disposed in the multilayer body 210 such that the surface of the thin-film capacitor 100 on which the terminal conductors 61 and 62 are provided faces the surface of the multilayer body 210 on which the input/output terminal conductors 241, 242, and 243 are provided.

The terminal conductor 62 and the input/output terminal conductor 243 overlap each other when the multilayer body 210 is viewed in the Z direction. The terminal conductor 62 and the input/output terminal conductor 243 are connected via an interlayer connection conductor 255.

The terminal conductor 61 and the inner end 2231 of the coil conductor pattern 223 overlap each other. The terminal conductor 61 and the inner end 2231 of the coil conductor pattern 223 are connected via an interlayer connection conductor 254.

With the above structure, the circuit of FIG. 3 is realized.

Advantageously, because the thickness of the thin-film capacitor 100 and the thicknesses of the coil conductor patterns 222 and 223 are smaller than the thicknesses of the resin sheets 212 and 213, it is possible to suppress differences in thickness between the regions of the multilayer body 210 having the thin-film capacitor 100 and the coil conductor patterns 222 and 223 and the regions not having the thin-film capacitor 100 and the coil conductor patterns 222 and 223, and to further increase the flatness. For example, in the case where the multilayer body 210 is formed by preparing the resin sheets 211, 212, 213, and 214 in advance at predetermined thicknesses, stacking them and subjecting them to heat-pressing, although easily affected by these differences in thickness, by using the configuration of the present embodiment, the differences in thickness are small and the flatness can be increased.

In addition, because the coil conductor patterns 222 and 223 each have a spiral shape, they hardly deform at the time of forming the multilayer body 210, and desired filter characteristics can be realized. Specifically, in the case where the multilayer body 210 is formed by preparing the resin sheets 211, 212, 213, and 214 in advance at predetermined thicknesses, stacking them and subjecting them to heat-pressing, the resin sheets 211, 212, 213, and 214 are deformed as a result of the effect of the differences in thickness. However, because the coil conductor patterns 222 and 223 are wound in a plurality of winding shapes (e.g., spiral shapes), even if the conductor patterns deviate from the helical coil conductor pattern at the time of forming the multilayer body (for example, at the time of heat-pressing), the inductance and internal capacitance of the coil itself do not change easily. That is, the self-resonant frequency of the coil hardly changes.

In addition, in the configuration of the present embodiment, the terminal conductor 62 faces the input/output terminal conductor 243 side of the multilayer body 210. As a result, it is easy to shorten the conductor that connects the terminal conductor 62 and the input/output terminal conductor 243 to each other and the parasitic inductance connected between the thin-film capacitor 100 and the ground potential can be reduced. Therefore, the LC filter 200 easily realizes desired filter characteristics.

Further, in the configuration of the present embodiment, the terminal conductor 62 and the input/output terminal conductor 243 are connected only by the interlayer connection conductor 255. As a result, the parasitic inductance connected between the thin-film capacitor 100 and the ground potential can be further reduced, and the LC filter 200 can more easily and accurately realize desired filter characteristics.

The LC filter 200 having such a configuration can be realized by the following manufacturing method. Specifically, FIGS. 4(A)-(E) and FIGS. 5(A)-(E) are cross-sectional views schematically illustrating structures in the process of manufacturing an LC filter according to the present embodiment. Further, a plurality of LC filters 200 are typically formed at the same time, to produce individual pieces. However, according to an exemplary aspect as shown in FIGS. 4(A)-(E) and FIGS. 5(A)-(E), a single LC filter 200 is illustrated.

Figure 4A:
FIGS. 4(A)-(E) are cross-sectional views schematically illustrating structures in a method of manufacturing an LC filter according to the exemplary embodiment.

(1) Initially, as illustrated in FIG. 4(A), a support plate SP is prepared, and the resin sheet 211 is formed on the surface of the support plate SP. For the resin sheet 211, a resin for a build-up method is used.

Figure 4B:

(2) As illustrated in FIG. 4(B), the coil conductor pattern 222 is formed on the surface of the resin sheet 211. The coil conductor pattern 222 is formed of a metal such as copper, and is formed by, for example, a semi-additive method or the like.

Figure 4C:
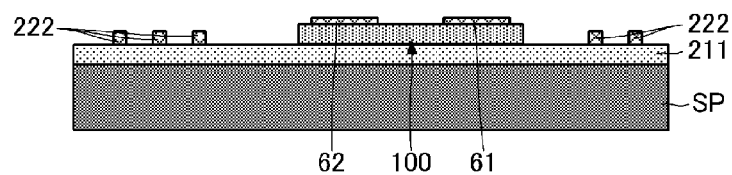

(3) As illustrated in FIG. 4(C), the thin-film capacitor 100 is bonded to the surface of the resin sheet 211. The thin-film capacitor 100 is adhered to the resin sheet 211 so that the terminal conductors 61 and 62 are on the side opposite to the front surface side of the resin sheet 211.

Figure 4D:
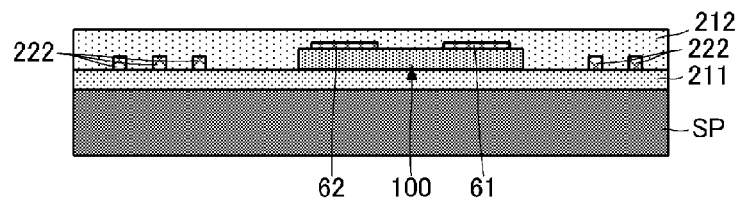

(4) As illustrated in FIG. 4(D), the resin sheet 212 is formed on the surface of the resin sheet 211. For the resin sheet 212, a resin for a build-up method is used. Preferably the resin sheet 212 is formed to have such a thickness as to completely cover the coil conductor pattern 222 and the thin-film capacitor 100. As a result, the thickness of the resin sheet 212 is larger than the thicknesses of the thin-film capacitor 100 and the coil conductor pattern 222.

Figure 4E:
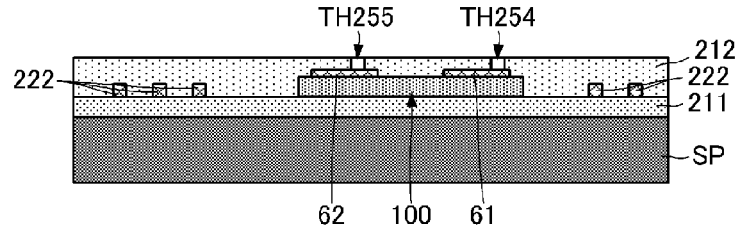

(5) As illustrated in FIG. 4(E), holes TH254 and TH255 are formed from the surface of the resin sheet 212. The hole TH254 overlaps a portion of the terminal conductor 61 and exposes a portion of the terminal conductor 61 to the surface of the resin sheet 212. The hole TH255 overlaps a portion of the terminal conductor 62 and exposes a portion of the terminal conductor 62 to the surface of the resin sheet 212. The holes TH254 and TH255 are realized by etching only the resin sheet 212 using selective etching using a photolithography method or the like or selective etching using a laser.

Figure 5A:
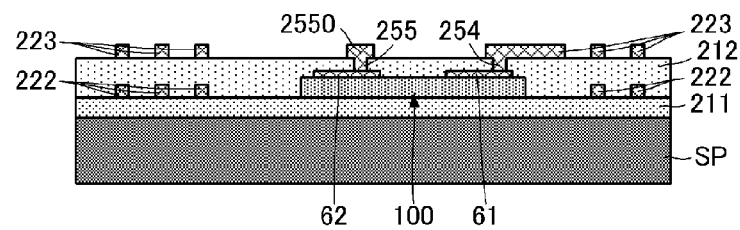
FIGS. 5(A)-(E) are cross-sectional views schematically illustrating structures in the method of manufacturing an LC filter according to the exemplary embodiment.

(6) As illustrated in FIG. 5(A), the coil conductor pattern 223 and an interlayer connection auxiliary conductor pattern 2550 are formed on the surface of the resin sheet 212. At this time, the hole TH254 is filled with a conductor and the interlayer connection conductor 254 is formed. In addition, the hole TH255 is filled with a conductor and the interlayer connection conductor 255 is formed. The interlayer connection conductor 254 is connected to the terminal conductor 61 and the coil conductor pattern 223, and the interlayer connection conductor 255 is connected to the terminal conductor 62 and the interlayer connection auxiliary conductor pattern 2550.

Figure 5B:
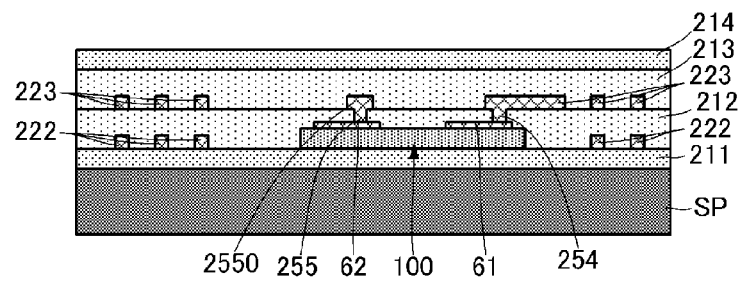

(7) As illustrated in FIG. 5(B), the resin sheet 213 and the resin sheet 214 are sequentially formed on the surface of the resin sheet 212. For the resin sheets 212 and 213, a build-up method resin is used. The resin sheet 213 is formed to have such a thickness as to completely cover the coil conductor pattern 223. As a result, the thickness of the resin sheet 213 is larger than the thickness of the coil conductor pattern 223.

Figure 5C:
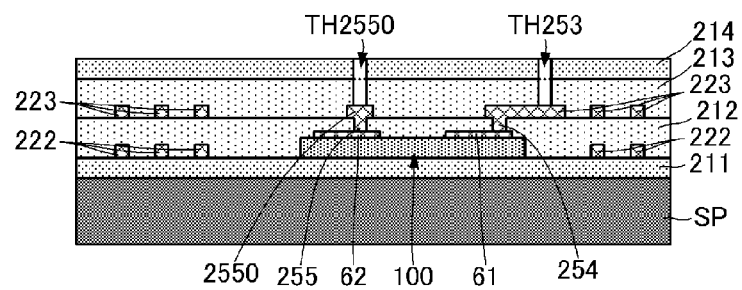

(8) As illustrated in FIG. 5(C), holes TH253 and TH2550 are formed from the surface of the resin sheet 214. The hole TH2550 overlaps the interlayer connection auxiliary conductor pattern 2550 and exposes a portion of the interlayer connection auxiliary conductor pattern 2550 to the surface of the resin sheet 214. The hole TH253 overlaps the coil conductor pattern 223 and exposes the vicinity of the inner end of the coil conductor pattern 223 to the surface of the resin sheet 214. The holes TH253 and TH2550 are realized by etching only the resin sheets 214 and 213 using selective etching using a photolithography method or the like or selective etching using a laser.

Figure 5D:
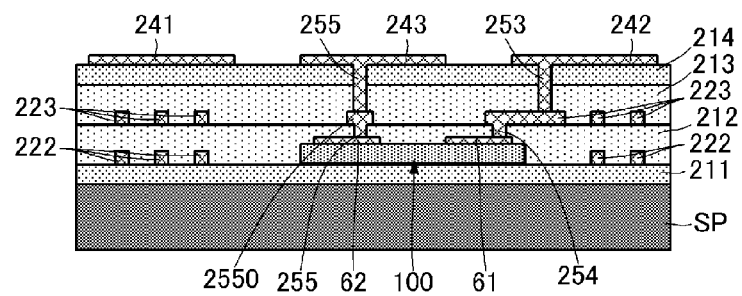

(9) As illustrated in FIG. 5(D), the input/output terminal conductors 241, 242, and 243 are formed on the surface of the resin sheet 214. At this time, the hole TH253 is filled with a conductor and the interlayer connection conductor 253 is formed. In addition, the hole TH2550 is filled with a conductor and the interlayer connection conductor 255 is formed. The interlayer connection conductor 253 is connected to the coil conductor pattern 223 and the input/output terminal conductor 242, and the interlayer connection conductor 255 is connected to the input/output terminal conductor 243 and the interlayer connection auxiliary conductor pattern 2550.

Figure 5E:
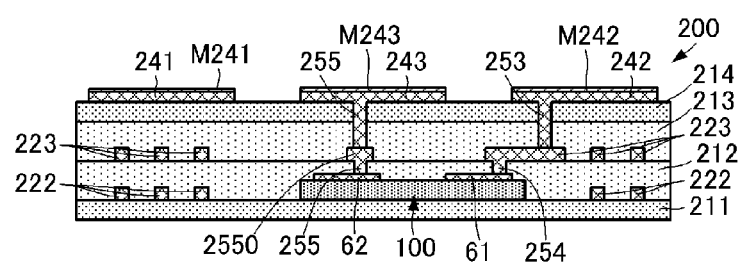

(10) Finally, As illustrated in FIG. 5(E), the support plate SP is peeled off. As a result, the LC filter 200 is formed. Further, as described above, after this peeling step, the plurality of LC filters 200 in a collective board state are cut into individual pieces. Then, they are tested, taped, and shipped as would be appreciated to one skilled in the art.

By using such a manufacturing method, the LC filter 200 having the above configuration can be easily manufactured.

Further, the LC filter 200 can also be realized by a manufacturing method in which the plurality of the resin sheets 211, 212, 213, and 214 are prepared with predetermined thicknesses and these are stacked and heat-pressed. In this case, formation of the coil conductor patterns 222 and 223 and arrangement of the thin-film capacitor 100 are performed before the heat-pressing.

In addition, the LC filter 200 according to the present embodiment may be suitably used as a filter of a power supply device, for example, as a low pass filter for a power supply device of an electric vehicle, but it can also have other uses.

Figure 6:
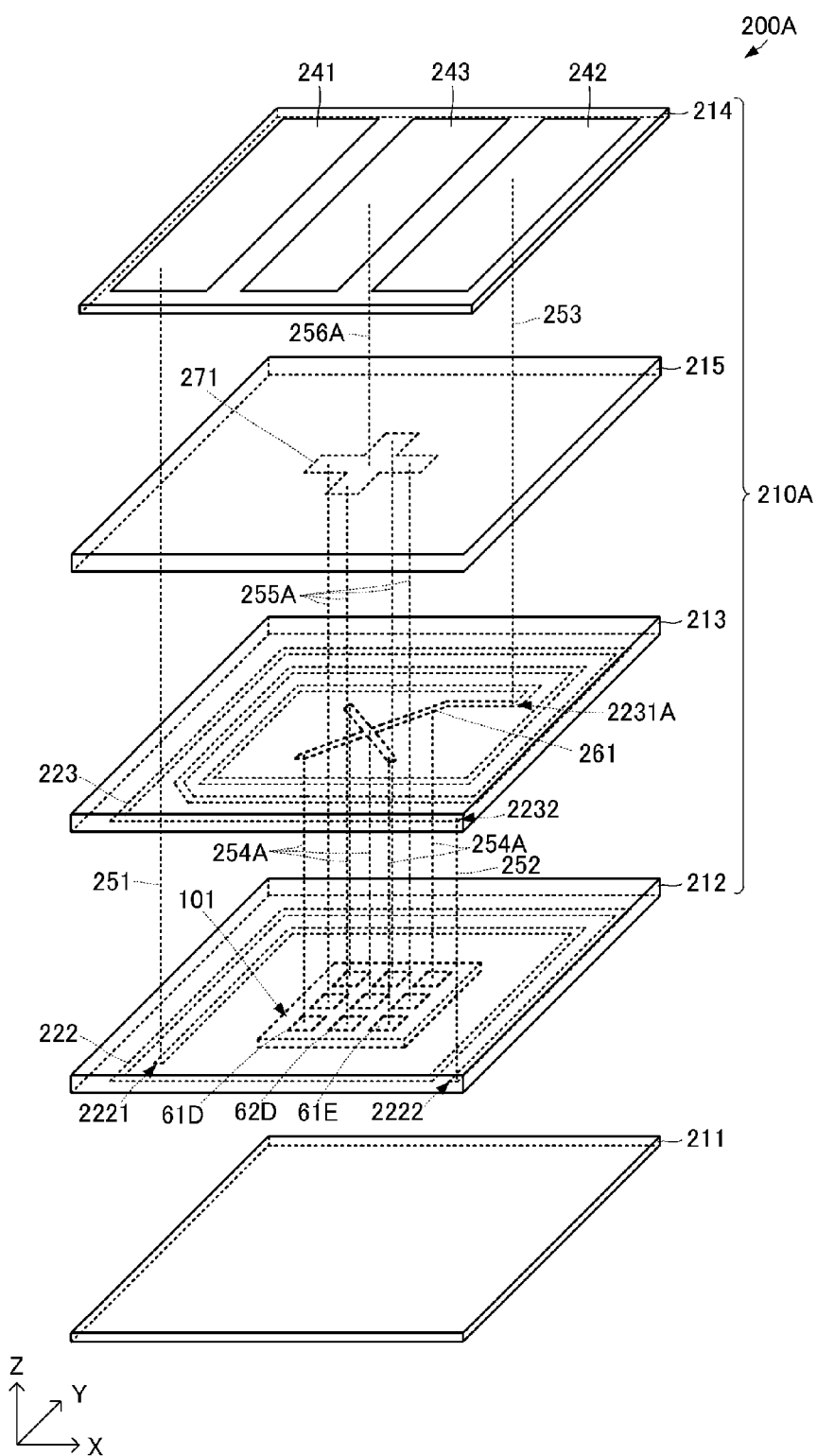
FIG. 6 is an exploded perspective view of an LC filter according to a second exemplary embodiment.
Figure 7:
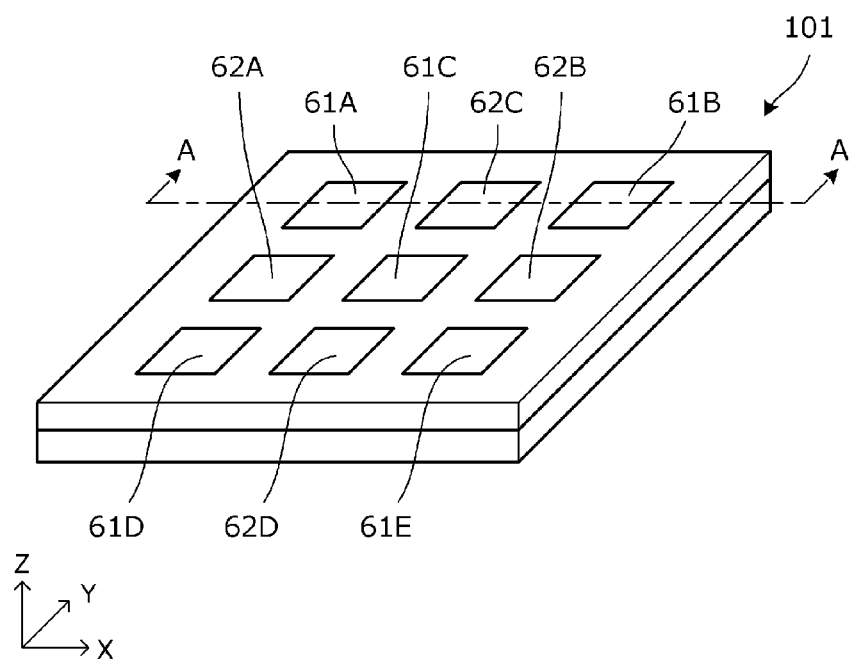
FIG. 7 is an external perspective view of a thin-film capacitor according to a second exemplary embodiment viewed from the rear surface.
Figure 8:
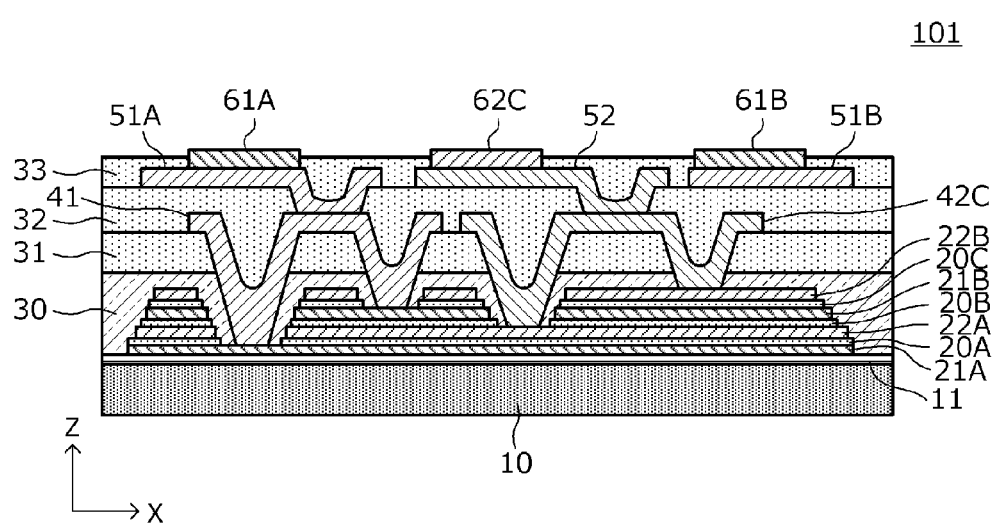
FIG. 8 is a cross-sectional view of the thin-film capacitor according to the second exemplary embodiment.

Next, an LC filter according to a second exemplary embodiment will be described with reference to the drawings. FIG. 6 is an exploded perspective view of the LC filter according to the second exemplary embodiment. FIG. 7 is an external perspective view of a thin-film capacitor according to the second exemplary embodiment when viewed from the rear surface. FIG. 8 is a cross-sectional view of the thin-film capacitor according to the second exemplary embodiment.

An LC filter 200A according to the second exemplary embodiment differs from the LC filter 200 according to the first exemplary embodiment described above in terms of the configuration of a thin-film capacitor 101, and is different in terms of the configuration of the wiring conductor that connects to the thin-film capacitor 101. Further, hereinafter, only different portions will be described in detail, and description of portions similar to those of the LC filter 200 according to the first exemplary embodiment will be omitted.

As shown in FIG. 6, for example, the LC filter 200A includes a multilayer body 210A and the thin-film capacitor 101. The multilayer body 210A differs from the multilayer body 210 according to the first embodiment in that a resin sheet 215 and wiring conductors 261 and 271 are added.

The resin sheet 215 is disposed between the resin sheet 213 and the resin sheet 214.

The wiring conductor 261 is disposed on the surface of the resin sheet 213 on the resin sheet 212 side and is embedded in the resin sheet 213. The wiring conductor 261 is connected to an inner end 2231A of the coil conductor pattern 223.

The wiring conductor 271 is disposed on the surface of the resin sheet 215 on the resin sheet 213 side and is embedded in the resin sheet 215.

A thin-film capacitor 100A is provided with terminal conductors 61A, 61B, 61C, 61D, and 61E and terminal conductors 62A, 62B, 62C, and 62D on the rear surface thereof. The internal structure of the thin-film capacitor 100A will be described below.

The terminal conductors 62A, 62B, 62C, and 62D of the thin-film capacitor 100A are connected to the wiring conductor 271 via interlayer connection conductors 255A. The wiring conductor 271 is connected to the input/output terminal conductor 243 via an interlayer connection conductor 256A.

The terminal conductors 61A, 61B, 61C, 61D, and 61E of the thin-film capacitor 100A are connected to the wiring conductor 261 via interlayer connection conductors 254A.

With such a configuration, the same operation and effects as those of the first embodiment are realized. In addition, in the LC filter 200A, the plurality of terminal conductors 62A, 62B, 62C, and 62D are connected to the input/output terminal conductor 243, which is configured as a common ground. As a result, parasitic inductances respectively connected to the ground sides of the plurality of terminal conductors 62A, 62B, 62C, and 62D are connected in parallel. This makes it possible to further reduce the parasitic inductance.

Next, a specific configuration of the thin-film capacitor 101 according to the present embodiment will be described. FIG. 7 is an external perspective view of the thin-film capacitor according to the second exemplary embodiment when viewed from the rear surface. FIG. 8 is a cross-sectional view of the thin-film capacitor according to the second exemplary embodiment.

As illustrated in FIG. 7, the thin-film capacitor 101 is an element having a predetermined capacitance between the terminal conductors 61A, 61B, 61C, 61D, and 61E and the terminal conductors 62A, 62B, 62C, and 62D.

The configuration of the thin-film capacitor 101 of the present embodiment will be described with the reference numerals of the portions illustrated in FIG. 8 assigned thereto.

(a) A substrate 10, (b) an adhesion layer 11 formed on a first main surface of the substrate 10, (c) first inner conductors 21A and 21B and second inner conductors 22A and 22B, which are formed on the adhesion layer 11, (d) a dielectric layer 20A provided between the first inner conductor 21A and the second inner conductor 22A, a dielectric layer 20B provided between the first inner conductor 21B and the second inner conductor 22A, a dielectric layer 20C provided between the first inner conductor 21B and the second inner conductor 22B, (e) a first intermediate conductor 41 provided on the upper layer side of the first inner conductors 21A and 21B and the second inner conductors 22A and 22B and connected to the first inner conductors 21A and 21B at a plurality of locations, (f) a plurality of second intermediate conductors provided on the upper layer side of the first inner conductors 21A and 21B and the second inner conductors 22A and 22B and connected to the second inner conductors 22A and 22B at a plurality of places (in the cross section in FIG. 8, the second intermediate conductor 42C is illustrated), (g) first surface conductors 51A and 51B that are provided on the upper layer side of the first intermediate conductor 41 and connected to the first intermediate conductor 41, (h) a second surface conductor 52 provided on the upper layer side of the second intermediate conductor 42C or the like and conducting to the second inner conductors 22A and 22B at a plurality of places, (i) A plurality of the terminal conductors 61A, 61B, 61C, 61D, and 61E formed on the upper surface of a first surface conductor 51 (in FIG. 8, the first terminal conductors 61A and 61B are illustrated), (j) A plurality of the terminal conductors 62A, 62B, 62C, and 62D formed on the upper surface of the second surface conductor (in FIG. 8, the second terminal conductor 62C is illustrated), (k) an inorganic insulating layer 30 covering the multi-layer body portion including the first inner conductors 21A and 21B, the second inner conductors 22A and 22B, and the dielectric layers 20A, 20B, and 20C, (l) a first organic insulating layer 31 that covers the inorganic insulating layer 30 and in which the first intermediate conductor 41 and the second intermediate conductor 42C are formed, (m) a second organic insulating layer 32 covering the first organic insulating layer 31 and having the first surface conductor 51A and 51B and the second surface conductor 52 formed thereon, (n) a third organic insulating layer 33 covering the second organic insulating layer 32 and exposing the terminal conductors 61A and 61B, the terminal conductor 62C, and the like.

In FIG. 8, the first inner conductor 21A, the second inner conductor 22A, and the dielectric layer 20A constitute a first capacitance portion, and the first inner conductor 21B, the second inner conductor 22A, and the dielectric layer 20B form a second capacitance portion and the first inner conductor 21B, the second inner conductor 22B and the dielectric layer 20C constitute a third capacitance portion.

The plurality of first surface conductors (51A, 51B, and the like) are temporarily commonly connected by the first intermediate conductor 41. Therefore, the effect of the directionality of the flow of current to and from the terminal conductors (61A, 61B, and the like) (direction dependence) is reduced. That is, because the bias (gradient) of the potential of the first surface conductor is reduced by the first intermediate conductor 41, concentration of current in the plane of the first inner conductors 21A and 21B is reduced. This reduces ESL and ESR. In addition, in the current paths from the first inner conductors 21A and 21B to the first surface conductors 51A and 51B, and the like, the number of current paths in parallel is increased, and the ESL and ESR are further reduced.

The capacitor of the present embodiment is a thin-film capacitor utilizing a thin-film process. In the thin-film capacitor, when the first inner conductors 21A and 21B and the second inner conductors 22A and 22B are formed of a refractory metal whose main component is Pt, a high dielectric constant material BST, which forms the dielectric layers 20A, 20B, and 20C, can be fired at an elevated temperature of about 800° C. to 1000° C. in an oxidizing atmosphere.

If the first intermediate conductor 41 and the second intermediate conductor 42C and the like are formed of a material having a small specific resistance such as a metal film containing Cu as a main component and the film thickness is increased, the sheet resistance can be made lower than the first inner conductor (Pt). Further, note that the first intermediate conductor 41 and the second intermediate conductor 42C and the like may be formed of a metal containing Al as a main component instead of Cu. This makes it possible to lower the ESR of the capacitor while using conductive materials suitable for the first inner conductors 21A and 21B and the second inner conductors 22A and 22B, which are the conductors that sandwich the dielectric layers 20A and 20B.

In addition, because the substrate 10 is a semiconductor substrate and the first inner conductor, the second inner conductor, the first intermediate conductor, the first surface conductor and the second surface conductor are metal thin films formed by a thin film process, a large-capacitance capacitor can be obtained.

In addition, in the present embodiment, because the terminal conductors 61A and 61B and the terminal conductor 62C, and the like formed of a Ni/Au plating film are formed on the first surface conductors 51A and 51B and the second surface conductors 52, the environmental resistance of the terminal conductors is high.

Further, in the present embodiment, because the first inner conductors 21A and 21B and the second inner conductors 22A and 22B have substantially the same outer shape and the first intermediate conductor 41 passes through openings formed in the second inner conductors 22A and 22B, the path length of the conductor that connects the first inner conductors 21A and 21B and the first intermediate conductor 41 to each other is shortened and an increase in the path length in the thickness direction from the first inner conductors 21A and 21B to the first surface conductors 51A and 51B, and the like can be suppressed.

In addition, the first surface conductors 51A and 51B are disposed with the second surface conductor 52 interposed therebetween. Further, in FIG. 8, other first surface conductors and the second surface conductors (not illustrated) are alternately arranged so as to sandwich each other in both the longitudinal and lateral directions. That is, a plurality of first surface conductors and a plurality of second surface conductors are arranged in a planar lattice pattern. As a result, the current is effectively dispersed by the first intermediate conductor 41 and the second surface conductor 52.

Further, according to the exemplary aspect, although the total number of the terminal conductors in the capacitor and the number of the mounting conductors in the circuit board is nine in total, three columns by three rows in total, it is noted that it may be a total of four, for example, two columns×two rows or a total of 25 such as five columns×five rows. Moreover, the total number is not limited to a square number.

Figure 9A:
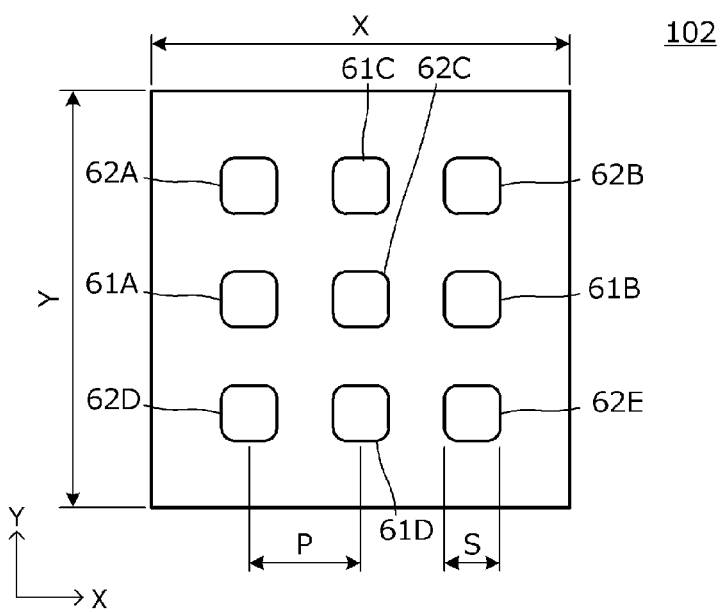
FIG. 9(A) is a plan view of a thin-film capacitor according to a third exemplary embodiment and FIG. 9(B) is a front view of the thin-film capacitor.
Figure 9B:
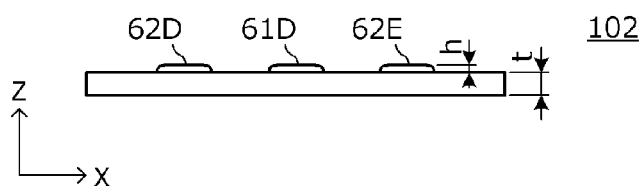
Figure 10:
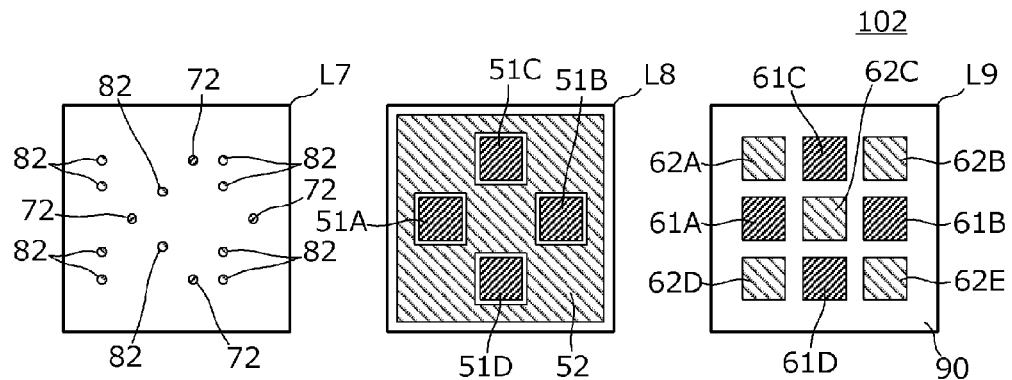
FIG. 10 is a plan view of several layers of the thin-film capacitor.
Figure 10:
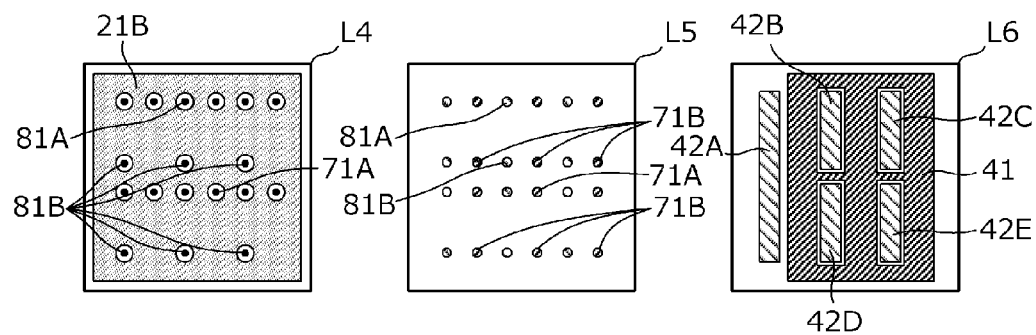
Figure 10:
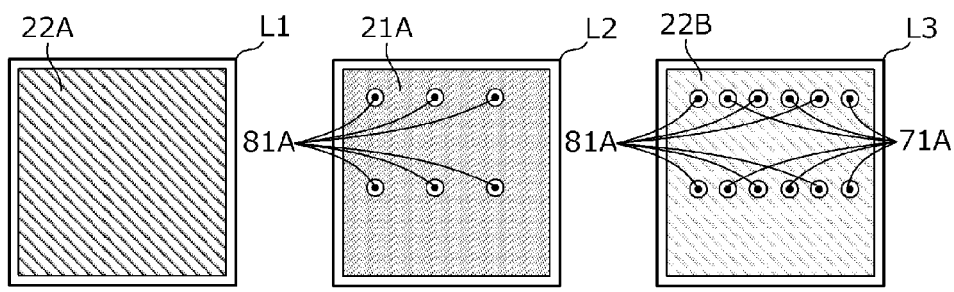
Figure 10:
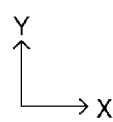

Next, an LC filter according to a third exemplary embodiment will be described with reference to the drawings. FIG. 9(A) is a plan view of the thin-film capacitor according to the third embodiment. FIG. 9(B) is a front view of the thin-film capacitor. The surface illustrated in FIG. 9(A) is the mounting surface (rear surface). FIG. 10 is a plan view of several layers of the thin-film capacitor. FIG. 11 is an exploded plan view illustrating the connection relationship between conductors in the layers of the thin-film capacitor.

As illustrated in FIG. 9(A) and FIG. 9(B), a thin-film capacitor 102 is provided with the terminal conductors 61A, 61B, 61C, and 61D and the terminal conductors 62A, 62B, 62C, 62D, and 62E. The dimensions of each part of the thin-film capacitor 102 are, for example, as follows:

X: 0.75 mm
Y: 0.75 mm
P: 0.2 mm
S: 0.1 mm
t: 0.04 mm
h: 0.02 mm

The thin-film capacitor 102 is an element having a predetermined capacitance between the terminal conductors 61A, 61B, 61C, and 61D and the terminal conductors 62A, 62B, 62C, 62D, and 62E, and may be used as, for example, a decoupling capacitor.

As illustrated in FIG. 10 and FIG. 11, the first inner conductors 21A and 21B are formed in layers L2 and L4 and the second inner conductors 22A and 22B are formed in layers L1 and L3. The first intermediate conductor 41 and second intermediate conductors 42A, 42B, 42C, 42D, and 42E are formed in a layer L6. The first surface conductors 51A, 51B, 51C, and 51D and the second surface conductor 52 are formed in a layer L8. The first terminal conductors 61A, 61B, 61C, and 61D and the second terminal conductors 62A, 62B, 62C, 62D, and 62E are formed in a layer L9, respectively.

An interlayer connection conductor 81A that connects the second inner conductor 22A and the second intermediate conductors 42A, 42B, 42C, 42D, and 42E to each other is formed between the layer L1 and the layer L6. Between the layer L2 and the layer L6, an interlayer connection conductor 71A that connects the first inner conductor 21A and the first intermediate conductor 41 to each other is formed. An interlayer connection conductor 81B that connects the second inner conductor 22B and the second intermediate conductors 42A, 42B, 42C, 42D, and 42E to each other is formed between the layer L3 and the layer L6. In the layer L5, an interlayer connection conductor 71B that connects the first inner conductor 21B and the first intermediate conductor 41 to each other is formed.

In addition, in the layer L7, an interlayer connection conductor 72 that connects the first intermediate conductor 41 and the first surface conductors 51A, 51B, 51C, and 51D to each other and an interlayer connection conductor 82 that connects the second intermediate conductors 42A, 42B, 42C, 42D, and 42E and the second surface conductor 52 to each other are formed.

The terminal conductors 61A, 61B, 61C, and 61D are formed on the surfaces of the first surface conductors 51A, 51B, 51C, and 51D. The terminal conductors 62A, 62B, 62C, 62D, and 62E are formed on the surface of the second surface conductor 52.

The basic configurations of the first capacitance portion and the second capacitance portion of the thin-film capacitor 102 are similar to those of the thin-film capacitor 101 according to the second exemplary embodiment described above.

The first intermediate conductor 41 commonly connects the plurality of first surface conductors 51A, 51B, 51C, and 51D. In addition, the second intermediate conductors 42A, 42B, 42C, 42D, and 42E commonly connect the second inner conductors 22A and 22B at a plurality of locations.

In this way, the plurality of the first surface conductors 51A, 51B, 51C, and 51D are temporarily commonly connected by the first intermediate conductor 41 and the second inner conductors 22A and 22B are commonly connected to the second surface conductor 52 via the second intermediate conductors 42A, 42B, 42C, 42D, and 42E. Therefore, the effect of the directionality of current flow into and out from the first terminal conductors 61A, 61B, 61C, and 61D and the second terminal conductors 62A, 62B, 62C, 62D, and 62E is reduced. That is, because the bias (gradient) of the potential of the first surface conductors 51A, 51B, 51C, and 51D is reduced by the first intermediate conductor 41, concentration of current in the plane of the first inner conductors 21A, 21B is reduced. In addition, because the bias (gradient) of the potential of the second inner conductors 22A, 22B is reduced by the second intermediate conductors 42A, 42B, 42C, 42D, and 42E and the second surface conductor 52, in the plane of the second inner conductors 22A and 22B, concentration of current at the end portion is reduced. This reduces ESL and ESR. In addition, in the current paths from the first inner conductors 21A and 21B to the first surface conductors 51A, 51B, 51C, and 51D, and the current paths from the second inner conductors 22A and 22B to the second surface conductors 52, the number of current paths in parallel is increased, and the ESL and ESR are further reduced.

According to the thin-film capacitor 102 of the present embodiment, the impedance becomes lower in the vicinity of the frequency of 300 MHz at which ESL becomes dominant. The impedance at this frequency corresponds to the ESL and the ESL is about 4 pH. Therefore, the ESL is improved as compared with the existing general configuration.

Further, in each of the exemplary embodiments described above, an aspect in which two spiral coil conductor patterns are formed as two layers in the multilayer body has been described; however, they may be formed as one layer or three or more layers. In addition, the thin-film capacitor is disposed at the same position as the spiral coil conductor pattern in the Z direction of the multilayer body; however, it may be disposed at a different position. However, in the Z direction of the multilayer body, it is preferable that the position of the thin-film capacitor and the position of the spiral coil conductor pattern overlap. As a result, it is possible to make the multilayer body thin and to more reliably suppress the deformation of the spiral coil conductor.

REFERENCE SIGNS LIST 10 substrate
11 adhesion layer
20A, 20B, 20C dielectric layer
21A, 21B first inner conductor
22A, 22B second inner conductor
30 inorganic insulating layer
31 first organic insulating layer
32 second organic insulating layer
33 third organic insulating layer
41 first intermediate conductor
42A, 42B, 42C second intermediate conductor
51, 51A first surface conductor
52 second surface conductor
61, 61A, 62, 62A, 62C terminal conductor
71A, 71B, 72, 81A, 81B, 82 interlayer connection conductor
100, 100A, 101, 102 thin-film capacitor
200, 200A LC filter
210, 210A multilayer body
211, 212, 213, 214, 215 resin sheet
222, 223 coil conductor pattern
241, 242, 243 input/output terminal conductor
251, 252, 253, 254, 254A, 255, 255A, 256A interlayer connection conductor
261, 271 wiring conductor
2222, 2232 outer end
2221, 2231, 2231A inner end
2550 interlayer connection auxiliary conductor pattern SP support plate
TH253, TH254, TH255, TH2550 hole

The invention claimed is:

1. An LC filter comprising:
a multilayer body including a plurality of stacked resin sheets;
a spiral-shaped coil conductor pattern embedded in a first resin sheet of the plurality of stacked resin sheets; and
a thin-film capacitor embedded in the first resin sheet and disposed in a coil opening of the spiral-shaped coil conductor pattern in a plan view of the first resin sheet,
wherein the thin-film capacitor is connected to the spiral-shaped coil conductor pattern,
wherein each of the spiral-shaped coil conductor pattern and the thin-film capacitor have respective thicknesses that are smaller than a thickness of the first resin sheet, and
wherein the multilayer body includes a first surface perpendicular to a stacking direction of the plurality of stacked resin sheets, and a plurality of input/output terminal conductors are disposed on the first surface of the multilayer body.

2. The LC filter according to claim 1,
wherein the plurality of input/output terminal conductors include a ground connection terminal conductor, and
wherein the thin-film capacitor includes, on an external connection surface thereof, at least one terminal conductor coupled to the ground connection terminal conductor.

3. The LC filter according to claim 2, wherein the thin-film capacitor is disposed inside the multilayer body so that the external connection surface faces the first surface.

4. The LC filter according to claim 3, further comprising wherein a wiring conductor disposed between the external connection surface and the first surface in the stacking direction, such that the wiring conductor connects the at least one terminal conductor of the thin-film capacitor to the ground connection terminal conductor.

5. The LC filter according to claim 4,
wherein the at least one terminal conductor of the thin-film capacitor comprises a plurality terminal conductors, and
wherein the wiring conductor connects each of the plurality of terminal conductors of the thin-film capacitor to the ground connection terminal conductor.

6. An LC filter comprising:
a multilayer body including a plurality of stacked resin sheets;
a spiral-shaped coil conductor pattern embedded in a first resin sheet of the plurality of stacked resin sheets;
an additional spiral-shaped coil conductor pattern embedded in a second resin sheet of the plurality of stacked resin sheets, with the second resin sheet stacked directly on the first resin sheet in a vertical direction of the LC filter; and
a thin-film capacitor embedded in the first resin sheet and disposed in a coil opening of the spiral-shaped coil conductor pattern in a plan view of the first resin sheet,
wherein the thin-film capacitor is connected to the spiral-shaped coil conductor pattern, and
wherein each of the spiral-shaped coil conductor pattern and the thin-film capacitor have respective thicknesses that are smaller than a thickness of the first resin sheet.

7. The LC filter according to claim 6, wherein respective outer ends of the spiral-shaped conductor pattern and the additional spiral-shaped coil conductor pattern are connected to each other via an interlayer conductor, such that the respective spiral-shaped coil conductor patterns form an inductor of the LC filter.

8. The LC filter according to claim 6, wherein the respective spiral-shaped coil conductor patterns comprise substantially a same thickness as each other.

9. A method of manufacturing an LC filter comprising:
forming a spiral-shaped coil conductor pattern on a surface of an auxiliary resin sheet;
disposing a thin-film capacitor in a coil opening of the spiral-shaped coil conductor pattern on the surface of the auxiliary resin sheet;
forming a first resin sheet on the surface of the auxiliary resin sheet to cover the coil conductor pattern and the thin-film capacitor;
forming a multilayer body by stacking a plurality of resin sheets, which include the auxiliary resin sheet and the first resin sheet that each have thermoplastic properties, with the multilayer body including a first surface perpendicular to a stacking direction of the plurality of stacked resin sheets;
heat-pressing the plurality of stacked resin sheets; and forming a plurality of input/output terminal conductors on the first surface of the multilayer body.

10. The method of manufacturing an LC filter according to claim 9, further comprising:
    forming the plurality of input/output terminal conductors to include a ground connection terminal conductor; and
    forming the thin-film capacitor to include, on an external connection surface thereof, at least one terminal conductor coupled to the ground connection terminal conductor.

11. The method of manufacturing an LC filter according to claim 10, further comprising disposing the thin-film capacitor inside the multilayer body so that the external connection surface faces the first surface.

12. The method of manufacturing an LC filter according to claim 11, further comprising forming a wiring conductor between the external connection surface and the first surface in the stacking direction, such that the wiring conductor connects the at least one terminal conductor of the thin-film capacitor to the ground connection terminal conductor.

13. The method of manufacturing an LC filter according to claim 12,
    wherein the at least one terminal conductor of the thin-film capacitor comprises a plurality terminal conductors, and
    wherein the wiring conductor connects each of the plurality of terminal conductors of the thin-film capacitor to the ground connection terminal conductor.

* * * * *